United States Patent
Koch et al.

[11] Patent Number: 5,918,003
[45] Date of Patent: Jun. 29, 1999

[54] ENHANCED BUILT-IN SELF-TEST CIRCUIT AND METHOD

[75] Inventors: Garrett Stephen Koch, Cambridge; Michael Richard Ouellette; Reid Allen Wistort, both of Westford, all of Vt.

[73] Assignee: International Business Machines Corporation, Armonk, N.Y.

[21] Appl. No.: 08/800,345

[22] Filed: Feb. 14, 1997

Related U.S. Application Data

[63] Continuation of application No. 08/473,641, Jun. 7, 1995, abandoned.

[51] Int. Cl.⁶ .................................................... G06F 11/00
[52] U.S. Cl. ..................... 395/183.06; 371/21.1; 371/22.5
[58] Field of Search ............ 395/183.06, 183.18, 395/183.08, 183.13; 371/21.1, 21.2, 21.3, 21.5, 22.1, 22.5, 22.6, 24, 27.1, 27.2, 27.5, 27.7

[56] References Cited

U.S. PATENT DOCUMENTS

| | | | |
|---|---|---|---|
| 4,313,200 | 1/1982 | Nishiura | 371/25.1 |
| 4,949,341 | 8/1990 | Lopez et al. | 371/25.1 |
| 5,006,787 | 4/1991 | Katirciog et al. | 371/21.2 |
| 5,075,892 | 12/1991 | Choy | 371/21.2 |
| 5,113,339 | 5/1992 | Woods et al. | 371/21.3 |
| 5,138,619 | 8/1992 | Fasang et al. | 371/21.1 |
| 5,146,458 | 9/1992 | Ono | 395/185.02 |
| 5,151,903 | 9/1992 | Mydill et al. | 371/27 |
| 5,173,906 | 12/1992 | Dreibelbi et al. | 371/22.5 |
| 5,175,836 | 12/1992 | Morgan | 711/172 |
| 5,224,101 | 6/1993 | Popyack, Jr. | 371/21.1 |
| 5,301,156 | 4/1994 | Talley | 371/22.3 |
| 5,301,199 | 4/1994 | Ikenaga et al. | 371/22.5 |
| 5,309,447 | 5/1994 | Moskowitz et al. | 371/22.4 |
| 5,375,091 | 12/1994 | Berry, Jr. et al. | 371/21.2 |
| 5,412,662 | 5/1995 | Honma et al. | 371/21.1 |
| 5,471,482 | 11/1995 | Byers et al. | 371/21.3 |
| 5,490,115 | 2/1996 | Shah et al. | 365/201 |
| 5,535,164 | 7/1996 | Adams et al. | 371/21.1 |
| 5,617,531 | 4/1997 | Crouch et al. | 395/183.06 |
| 5,640,539 | 6/1997 | Goishi et al. | 371/22.6 |

*Primary Examiner*—Joseph E. Palys
*Attorney, Agent, or Firm*—Schmeiser, Olsen & Watts; Eugene Shkurko

[57] ABSTRACT

An Array Built-In Self Test (ABIST) circuit places on-chip circuits such as memory arrays in a known state, then stops. In the alternative, the ABIST circuit may initialize to a particular subcycle within a pattern sequence, and repeatedly loop on the subcycle, or repeatedly loop on the entire pattern sequence.

3 Claims, 3 Drawing Sheets

| CB 0 | CB 1 | RESULT |
|---|---|---|
| 0 | 0 | NORMAL ABIST OPERATION |
| 0 | 1 | STOP ABIST AT INVERTED CHECKERBOARD PATTERN |
| 1 | 0 | STOP ABIST AT TRUE CHECKERBOARD PATTERN |
| 1 | 1 | LOOP ALL ABIST PATTERNS |

ENHANCED BUILT-IN SELF-TEST CIRCUIT AND METHOD

CROSS REFERENCE TO RELATED APPLICATION

This application is a continuation of application Ser. No. 08/473,641, filed Jun. 7, 1995, now abandoned.

This application is related to a co-pending application Dkt. No. BU9-95-035 filed Jun. 7, 1995 as U.S. Ser. No. 08/485,296 entitled "BUILT-IN SELF-TEST CIRCUIT HAVING A PROGRAMMABLE PATTERN GENERATOR FOR ALLOWING UNIQUE READ/WRITE OPERATIONS TO ADJACENT MEMORY CELLS, AND METHOD THEREFOR".

BACKGROUND OF THE INVENTION

1. Technical Field

This invention generally relates to testing of integrated circuits, and more specifically relates to built-in self-test circuits and methods implemented on an integrated circuit chip to test the function of a portion of the integrated circuit, such as a memory array.

2. Background Art

Advances in integrated circuits have enhanced the ability to integrate increasingly more circuits on a single chip. As the circuit complexity on a chip increases, so does the need to thoroughly test the circuits. However, many of these circuits have few or no connections that are accessible to external test equipment, making the direct testing of these circuits by external equipment very difficult or impossible altogether. A general solution to the problem of testing integrated circuits is to embed test circuitry on the chip itself, commonly known as Array Built-In Self-Test (ABIST) circuits. ABIST circuits typically test the functionality of an on-chip circuit and provide a failure indication if the circuit is not functioning properly.

As the number of circuits integrated onto a single chip increases, the complexity and sophistication of on-chip self-test circuits also increases. A variety of different types of self-test circuits are known for different applications. One such type of self-test circuit generates random data patterns to apply to the memory array. Examples of random data self-test circuits include: U.S. Pat. No. 5,331,643 "Self-Testing Logic with Embedded Arrays" (issued Jul. 19, 1994 to Smith and assigned to IBM); U.S. Pat. No. 5,301,199 "Built-In Self Test Circuit" (issued Apr. 5, 1994 to Ikenega el al. and assigned to Nippon Telegraph and Telephone Corp.); U.S. Pat. No. 5,138,619 "Built-In Self Test for Integrated Circuit Memory" (issued Aug. 11, 1992 to Fasang et al. and assigned to National Semiconductor Corp.); and U.S. Pat. No. 5,006,787 "Self-Testing Circuitry for VLSI Units" (issued Apr. 9, 1991 to Katircioglu et al. and assigned to Unisys Corp.). All the patents listed above are incorporate herein by reference.

Self-test circuits that generate random data, such as those listed above, cannot be used for deterministic testing of the memory array, i.e., to test the array with a defined sequence of data. In addition, random data cannot place the memory array in a known state, which is required, for example, during Static Voltage Screen (SVS) testing. However, other self-test circuits are known which generate programmable data. For example, U.S. Pat. No. 5,224,101 "Micro-Coded Self-Test Apparatus for a Memory Array" (issued Jun. 29, 1993 to Popyack, Jr. and assigned to the United States) discloses a self-test circuit that uses a microcode sequencer to determine the testing algorithm from the contents of a Read Only Memory (OM), and is incorporated herein by reference. Once the algorithm has been programmed into the ROM, however, the testing algorithm is fixed, and cannot be re-programed for different test parameters. U.S. Pat. No. 5,301,156 "Configurable Self-Test for Embedded Rams" (issued Apr. 5, 1994 to Talley and assigned to Hewlett Packard Co.) discloses a self-test circuit that has a serial scan path that passes through the address and data portions of the circuit to allow scanning a test vector into the self-test circuit, and to allow scanning the results of the test out of the self-test circuit. While the data may be dynamically changed by scanning in a new test vector, this process of scanning in data each time the data changes during the test is very time-consuming, making the testing of large memory arrays excessively slow and impractical. The two patents discussed above are incorporated herein by reference.

One example of an improved ABIST circuit is disclosed in U.S. Pat. No. 5,173,906 "Built-In Self Test for Integrated Circuits" (issued Dec. 22, 1992 to Dreibelbis et al.), which is also incorporated herein by reference. The ABIST circuit disclosed by Dreibelbis et al. provides five fixed patterns and one programmable (PG) pattern for testing a memory array. The PG pattern provides for greater flexibility in testing a circuit such as a memory array by providing configuration variables that determine the specific programming pattern and sequence to be applied by the ABIST circuit to the cells within the memory array.

The PG pattern generator within the ABIST circuit of Dreibelbis et al. initializes appropriate configuration variables using scan chain initialization, a technique that is known in the art. Each pattern typically consists of one or more subcycles: RC1, RC2, WC, RC3, and RC4. A subcycle defines the R/W operation performed on the memory array under test as its entire address space is ascended or descended by the ABIST state machine's address counter. When the last address is reached, a new subcycle is commenced and the array's address space is again traversed. The WC subcycle is a blanket write cycle, wherein every cell within the memory array is written with the same data, either a zero or a one. During the RC1, RC2, RC3 and RC4 subcycles, the cells within the memory array may be read or written. It is typically during the RC3 and RC4 subcycles that the programmable operations are performed.

The ABIST circuit of Dreibelbis et al. typically executes each of the five fixed patterns along with the programmable pattern in sequential fashion. Each of the six test patterns have a code corresponding to the output of a three bit binary counter. The starting point for the test sequence may be selected by loading in the appropriate codes during scan-in initialization. A looping feature, when enabled, causes the ABIST circuit to loop on a given pattern, repeating all the subcycles for that pattern.

The ABIST circuit disclosed by Dreibelbis et al. was a significant advancement over the existing prior art at the time by providing the capability to continue looping through a pattern rather than having the ABIST circuit stop at the end of the test. However this looping capability requires the ABIST to repeat all the subcycles in a given pattern, which may be undesirable in certain circumstances.

For Static Voltage Screen (SVS) testing, it is generally desirable to put the memory array in a known state, preferably checkerboard, for a given period of time, followed by a different known state, preferably an inverse checkerboard, for a second period of time. The checkerboard/inverse checkerboard sequence is needed for SVS testing, yet the ABIST circuit of Dreibelbis et al. does not allow for stopping the ABIST when the memory array is in a known state.

The need for placing a memory array in a known state is complicated by the presence of several memory arrays of different size, each of which have a corresponding ABIST circuit. While the circuit of Dreibelbis et al. could be used for each ABIST to loop the checkerboard pattern, the steps which the subcycles perform during the checkerboard pattern are:

1) Write a checkerboard pattern
2) Read the checkerboard pattern
3) Write an inverse checkerboard pattern
4) Read the inverse checkerboard pattern If there are several memory arrays that are different sizes, the continuous looping of this checkerboard pattern by each ABIST will result in both the true and inverse checkerboard being written repeatedly. Thus, if the ABIST is stopped, there is no way of assuring that all the memory arrays are in a known state, since a portion of a particular memory array may be in inverse checkerboard state while the rest is in checkerboard state.

Furthermore, in situ burn-in testing requires that the circuits in the memory array be exercised repeatedly during the test. One way to exercise the memory array is to continually loop the entire ABIST pattern, as disclosed in Dreibelbis et al. Another desirable method for exercising the circuitry of the memory array during burn-in is to continually loop on one particular subcycle within the ABIST pattern sequence, which is impossible using the ABIST circuit of Dreibelbis et al.

Therefore, there existed a need to provide an ABIST circuit that may be stopped once the memory array is in a known state. This capability is useful, for example, in SVS testing. In addition, there existed a need to provide an ABIST circuit that can repeatedly cycle on a given step (i.e., subcycle within a pattern). This capability is especially useful to exercise the circuitry in the memory array during in situ burn-in testing.

DISCLOSURE OF INVENTION

According to the present invention, an enhanced ABIST circuit allows for stopping the ABIST circuit once the memory array is in a known state. In addition, the ABIST circuit allows for continually looping a particular step (i.e., subcycle) within a selected pattern.

The foregoing and other objects, features and advantages of the invention will be apparent from the following more particular description of a preferred embodiment of the invention, as illustrated in the accompanying drawings.

BRIEF DESCRIPTION OF THE DRAWINGS

The preferred exemplary embodiment of the present invention will hereinafter be described in conjunction with the appended drawings, where like designations denote like elements, and.

BEST MODE FOR CARRYING OUT THE INVENTION

Figures 1, 3:
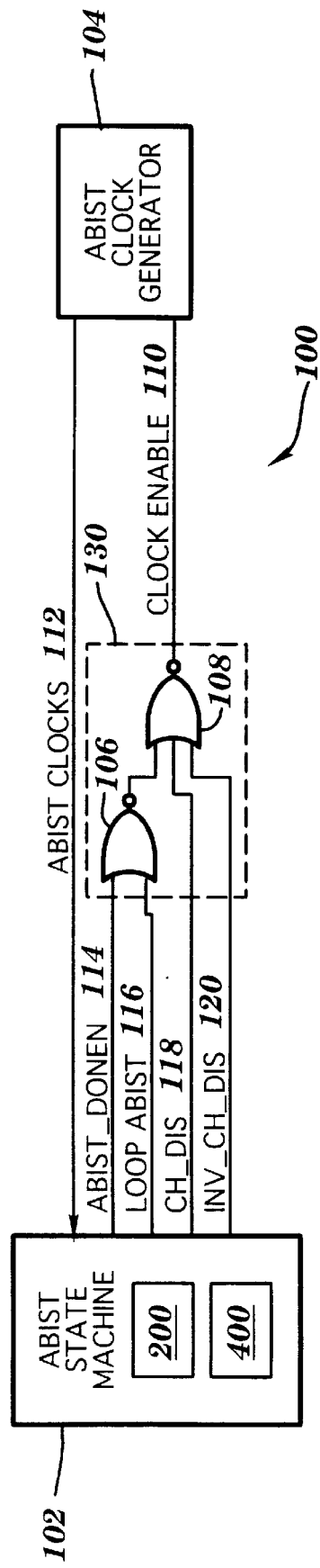
FIG. 1 is a block diagram of an enhanced ABIST circuit in accordance with the present invention.
FIG. 3 is a state table showing the results of programming the control bits CB0 and CB1 of FIG. 2.

Referring to FIG. 1, an ABIST circuit 100 in accordance with the present invention is provided for the testing of circuitry on an integrated circuit, such as a memory array. ABIST circuit 100 suitably comprises an ABIST state machine 102 coupled through logic 130 (e.g., gates 106 and 108) to an ABIST clock generator 104. ABIST state machine 102 suitably provides address, data and control signals to the circuitry under test to exercise the circuitry under test as thoroughly as practicable given the space and performance constraints imposed by the particular integrated circuit under test.

ABIST state machine 102 suitably includes circuitry 200 which provides outputs to logic 130 to disable ABIST clock generator 104 after a selected pattern has been written to the memory array, or, in the alternative, to cause ABIST state machine 102 to continually loop through its entire sequence of patterns. The capability of ABIST circuit 100 to stop on a given sequence allows ABIST circuit 100 to put the memory array in a known state, which is advantageous for SVS testing. In addition, ABIST state machine 102 suitably includes circuitry 400 for causing state machine 102 to continually loop through a particular subcycle, such as writing a known pattern to the memory array. Circuitry 400 causes ABIST circuit 100 to continually exercise the memory array with a known pattern or sequence, which is useful, for example, during in situ burn-in testing.

ABIST clock generator 104 contains a plurality of clock circuits (not shown) for generating all the different clock signals required by ABIST state machine 102. ABIST clock generator 104 suitably provides the ABIST clocks 112 to ABIST state machine 102 when a clock enable input 110 is active, and inhibits ABIST clocks 112 when clock enable 110 is inactive. For the particular implementation shown in FIG. 1, clock enable is shown as active high, and is generated by NOR gate 108. One input of gate 108 is coupled to the output of NOR gate 106, while the other two inputs are coupled to clock disable signals suitably generated by circuitry 200 within ABIST state machine 102. One input to NOR gate 106 is an ABIST_DONEN signal 114 which is driven low by ABIST state machine 102 when all the ABIST patterns have been generated, to signal that the ABIST test is complete. The other input to NOR gate 106 is from a loop ABIST signal 116 which is driven high by circuitry 200 within ABIST state machine 102 to signal to ABIST state machine 102 to continually loop through its entire sequence of patterns. When loop ABIST 116 is high, the output of NOR gate 106 is driven low, effectively disabling the effect that ABIST_DONEN 114 would normally have of negating clock enable 110, which would normally cause the execution of ABIST state machine 102 to halt.

Note that clock enable 110 is only active (high) when all three inputs to gate 108 are low. Thus, any of the inputs to gate 108 going high will have the effect of negating clock enable 110, which will cause ABIST clock generator 104 to kill (i.e., disable) ABIST clocks 112 to ABIST state machine 102.

Figure 2:
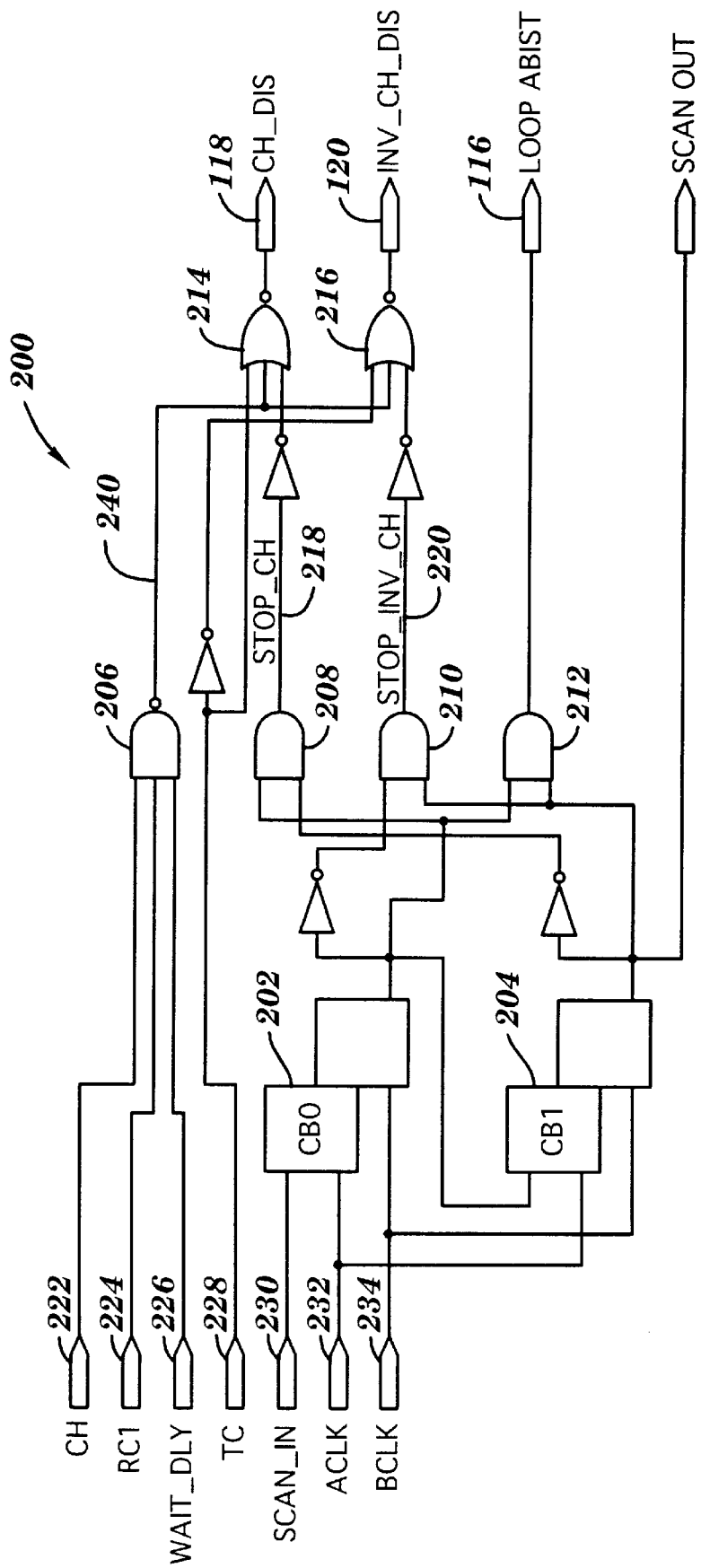
FIG. 2 is a schematic diagram of the block 200 within the ABIST state machine of FIG. 1.

Referring to FIG. 2, circuitry 200 within ABIST state machine 102 suitably comprises a plurality of inputs 222–234 from ABIST state machine 102, two control bit latches CB0 (202) and CB1 (204), various logic represented by gates 206, 208, 210, 212, 214, and 216. Circuit 200 suitably provides a plurality of outputs 116, 118, and 120, which are selectively used to effect the assertion of clock enable 110 in certain circumstances, as described below.

The function of circuit 200 may best be understood with reference to the state table of FIG. 3. Latches 202 and 204 suitably comprise control bit 0 (CB0) and control bit 1 (CB1), respectively. Latches 202 and 204 are suitably configured with initial values using scan chain initialization, a technique that is known in the art. The initial values of CB0 and CB1 are scanned in on the SCAN_IN line in serial fashion using ACLK and BCLK. SCAN_OUT simply provides an output to other devices in the scan chain. As shown in FIG. 3, with CB0 and CB1 both set to zero, normal ABIST operation occurs. The outputs of latches 202 and 204 drive the inputs of gates 208, 210 and 212 such that the outputs are all driven low, which causes signals 116, 118, and 120 to be driven low (FIG. 1), making ABIST_DONEN 114 the only signal that can negate clock enable 110. In this "normal" mode of ABIST operation, ABIST state machine 102 executes its entire sequence of patterns from first to last, followed by asserting the ABIST_DONEN signal 114. The ABIST_DONEN signal 114 going low causes clock enable 110 to be driven low (disabled), which in turn causes ABIST clock generator 104 to kill ABIST clocks 112 to ABIST state machine 102, thereby halting the execution of ABIST state machine 102.

When CB0 is set to zero and CB1 is set to one, gates 208, 210 and 212 are driven such that the outputs of gates 208 and 212 are driven low, while the STOP_INV_CH output 220 of gate 210 is driven high. ABIST state machine 102 will execute its sequence of patterns until the checkerboard pattern is written, at which time the CH signal 222 is driven high. When ABIST state machine 102 enters an RC1 subcycle of a pattern, the RC1 input 224 to circuit 200 goes high. WAIT_DLY 226 is a signal that is used to synchronize the negation of clock enable 110 with the end of the current subcycle. Thus, the output 240 of gate 206 is driven low (active) at the very end of a checkerboard RC1 subcycle. This signal 240 is gated with true and complement states of TC 228 (low for true checkerboard, high for inverse checkboard), STOP_CH 218, and STOP_INV_CH 220 to drive INV_CH_DIS 120 high at the end of the inverse checkerboard RC1 subcycle when CB0 is zero and CB1 is one. When INV_CH_DIS 120 goes high, clock enable 110 is driven low by gate 108, causing ABIST clock generator 104 to kill ABIST clocks 112 to ABIST state machine 102, halting operation of ABIST state machine 102. Thus, by setting CB0 to zero and CB1 to one, ABIST state machine 102 executes its sequence of patterns normally until the inverse checkerboard subcycle is performed, at which time ABIST state machine 102 stops, leaving the memory array in an inverse checkerboard pattern.

When CB0 is one and CB1 is zero, gates 208, 210 and 212 are driven such that the outputs of gates 210 and 212 are driven low, while the STOP_CH output 218 of gate 208 is driven high. Once ABIST state machine 102 encounters the end of the RC1 subcycle writing a true checkerboard pattern, CH_DIS 118 is driven high, causing clock enable 110 to be driven low (disabled). This causes ABIST clock generator 104 to kill ABIST clocks 112, thereby halting ABIST state machine 102 and leaving the memory array in a true checkerboard pattern.

When CB0 and CB1 are both one, gates 208, 210 and 212 are driven such that the outputs of gates 208 and 210 are driven low, while the loop ABIST output 116 of gate 212 is driven high. When loop ABIST 116 is high (FIG. 1), the output of gate 106 is driven low, which inhibits ABIST_DONEN 114 from having any effect on clock enable 110. Since clock enable 110 is not negated when the ABIST state machine 102 completes all its sequence of patterns, ABIST state machine 102 will continue execution by starting again, continually looping through its entire sequence of patterns. This looping may be useful, for example, during in situ burn-in testing of integrated circuit devices that have integrated thereon ABIST circuit 100.

Circuit 200 in accordance with the present invention thus provides the capability of selecting, via programmable latches CB0 and CB1 during scan-in initialization, whether the ABIST state machine will operate normally (i.e., will complete its sequences and stop), will stop once a checkerboard pattern is written to the memory array, will stop once an inverse checkerboard is written to the memory array, or will continually loop through its entire sequence of patterns. Note that stopping on a checkerboard pattern or on an inverse checkerboard pattern (as shown in the figures) are simply specific examples of the more general case of halting ABIST state machine 102 once any desired known pattern is written to the memory array. The scope of the present invention extends to stopping the ABIST state machine after any desired pattern is written to the memory array.

Figure 4:
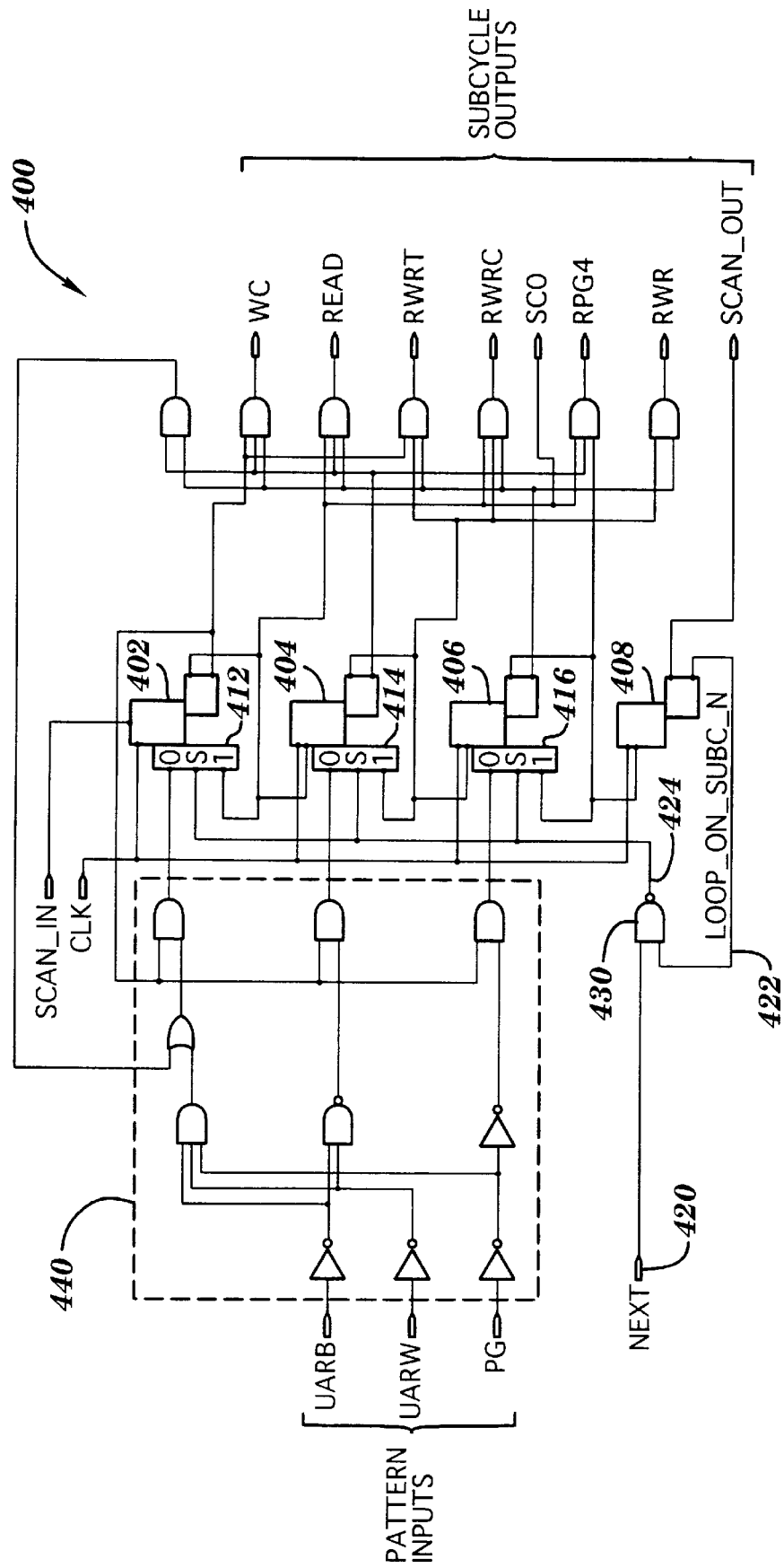
FIG. 4 is a schematic diagram of the sequence control logic of the ABIST circuit of FIG. 1 which allows for looping on a particular subcycle within a pattern.

Another circuit 400 within ABIST state machine 102 adds another important capability to ABIST circuit 100. Circuit 400 is analogous to the circuit of FIG. 9 of Dreibelbis et al., which provides subcycle outputs corresponding to the various subcycles for each data pattern. Referring to FIG. 4, circuit 400 suitably comprises multiple latches 402, 404, 406 and 408, which are initialized during scan-in initialization. Latches 402, 404 and 406 suitably determine which subcycle outputs are asserted during the various patterns of ABIST state machine 102. Each latch 402, 404 and 406 each have corresponding input data multiplexers 412, 414 and 416. These multiplexers 412, 414 and 416 selectively apply the next state to the data inputs of the latches when the select input S is low, and feed back the true output of each of these latches to their data inputs when S is high. Thus, since output 424 of gate 430 drives all the S inputs to multiplexers 412, 414 and 416 in parallel, when output 424 is low, latches 402, 404 and 406 are loaded with the data corresponding to the next subcycle, as provided by logic 440. However, when output 424 is high, latches 402, 404 and 406 remain in their same state, causing the same subcycle to be performed repeatedly. This same control signal 422 is used to restrict the change in test mode provided by the test mode control within the state machine 102.

Output 424 of gate 430 is driven low (thereby advancing latches 402, 404 and 406 to their next state on the next transition of CLK) only when both the NEXT signal 420 is high and the LOOP_ON_SUBCN signal 422 is high. NEXT 420 is a signal provided by ABIST state machine 102 to indicate that the next subcycle should be loaded. LOOP_ON_SUBCN 422 is a complement output from latch 408, which is a bit that is programmed during scan-in initialization of all the latches 402, 404, 406 and 408. Thus, if latch 408 is programmed with a one, LOOP_ON_SUBCN 422 will be driven low (true), which will cause the output 424 of gate 430 to go high. The select lines S of multiplexers 412, 414 and 416 will thus be driven high, causing the latches to latch the data from their true outputs on each appropriate transition of CLK, effectively locking latches 402, 404 and 406 into their current state. By programming latch 408 to a one (true), whatever subcycle is initialized into latches 402, 404 and 406 during scan-in initialization will remain the only subcycle that is executed. This allows ABIST state machine 102 to be initialized to a specific subcycle to repeat the selected subcycle indefinitely. This has specific advantages for in situ burn-in testing, as described below.

If an integrated circuit has several memory arrays, and each has a corresponding ABIST circuit in accordance with the present invention, all linked together in one long scan-chain, all the ABIST circuits may then be initialized in one operation, and may begin execution concurrently. Assume, for example, that SVS testing is to be performed, requiring that each memory array be placed in a true checkerboard state for a period of time, followed by an inverse checkerboard state. With the ABIST circuits of the prior art, there was no way provided to stop on a particular subcycle. The ABIST circuit of the prior art could loop, repeating the checkerboard pattern, but the subcycles within the checkerboard pattern alternatively write true and inverse checkerboards. So by simply looping through the checkerboard pattern and stopping, the memory array may be all true checkerboard, all inverse checkerboard, or part of each. The prior art ABIST circuit would typically wait for a period of time to execute the checkerboard pattern in the largest memory array. Meanwhile, the ABIST circuits for the smaller memory arrays may repeatedly loop on the checkerboard pattern, but the state of the memory array at any particular stopping point is unknown, and likely to be a combination of checkerboard and inverse checkerboard.

Using ABIST circuit 100 in accordance with the present invention, in contrast, allows each ABIST to perform only the specific subcycle needed, such as a write of a true checkerboard, and then stop. For SVS testing, the time to configure all of the memory arrays with a true checkerboard pattern will be the time required for the ABIST circuit 100 for the largest memory array to complete the write of the true checkerboard, since the smaller memory arrays will be configured in a checkerboard and their respective ABIST circuits 100 will be already stopped by the time the largest memory array is written in a true checkerboard. The ABIST circuit 100 of the present invention thus allows any number of memory arrays on an integrated circuit to each be configured by their respective ABIST circuits with a known pattern, such as a true or inverse checkerboard pattern which is especially useful for SVS testing.

Other problems arise when multiple memory arrays on an integrated circuit are to be tested for in situ burn-in. If one memory array, for example, is fifty times larger than a second memory array, and the ABIST circuits simply stop after performing a specific pattern or subcycle, the smaller memory array will complete its pattern in two percent of the time required to complete the pattern in the larger array. Assuming the ABIST circuits share a common scan-in initialization chain (the typical case), the smaller circuit will then remain idle for the other ninety-eight percent of the time required to finish writing the pattern to the larger memory array. All the ABIST circuits cannot be reconfigured via scan-in initialization to repeat the test until the ABIST circuit for the largest memory array has completed writing the desired pattern, since the same clocks are used for scan-in and for operation of the ABIST circuit 100. The result is that the smaller memory arrays are idle for a large portion of the time. This idle time is undesirable during burn-in testing, since the circuit elements must be exercised an appropriate number of times to perform the test.

ABIST circuit 100 of the present invention overcomes this problem, however, by providing the capability to loop on a particular subcycle, or to loop on the entire ABIST pattern sequence. Thus, when the ABIST circuit 100 for the smaller memory array completes its sequence in two percent of the time required for the larger memory array, it can recommence either the entire sequence, or can simply repeat a specific subcycle initialized during scan-in initialization. This allows the ABIST circuits 100 for each memory array to repetitively exercise the same circuits by looping while other ABIST circuits 100 perform similar functions on their respective memory arrays. In this manner, the circuit elements of a smaller memory array do not remain idle waiting for an ABIST circuit of a larger array to complete. This concurrent looping feature allows an integrated circuit to be tested in much less time than was possible with the prior art ABIST circuits and methods.

While the invention has been particularly shown and described with reference to a preferred exemplary embodiment thereof, it will be understood by those skilled in the art that various changes in form and details may be made therein without departing from the spirit and scope of the invention. In addition, it will be understood that, while various of the conductors or connections are shown in the drawing as single lines, they are not so shown in a limiting sense, and may comprise plural conductors or connections, as is understood in the art.

What is claimed is:

1. An on-chip built-in test circuit for a memory array comprising:

a state machine for writing a plurality of data patterns to the memory array in a pattern sequence, wherein the pattern sequence is written in a plurality of subcycles;

means for indefinitely halting the state machine once the state machine has placed the memory array in a known state by writing a predetermined data pattern into the memory array; and means for causing the state machine to repeatedly loop on a selected subcycle until the state machine is halted.

2. An on-chip built-in test circuit for an integrated circuit having a plurality of memory arrays, the on-chip built-in test circuit comprising:

a state machine for each memory array for writing a plurality of data patterns to the corresponding memory array in a pattern sequence;

means for halting all of the state machines once the state machine for a selected one of the plurality of memory arrays has written a predetermined data pattern into the selected memory array, resulting in each memory array containing the same predetermined data pattern; and means for causing the state machines of the non-selected memory arrays to repeatedly loop on writing the predetermined data pattern to their respective memory arrays until the state machines are halted.

3. A method for placing all of a plurality of memory arrays within an integrated circuit in a known state by a plurality of on-chip built-in test circuits, the method comprising the steps of:

providing a state machine for each memory array for writing a plurality of data patterns to the corresponding memory array in a pattern sequence;

providing means for halting the plurality of state machines once a selected state machine has written a predetermined data pattern into a selected one of the memory arrays;

providing means for causing the state machines of the non-selected memory arrays to repeatedly loop on writing the predetermined data pattern into their respective memory arrays until the plurality of state machines are halted;

initiating each of the plurality of state machines to write the predetermined data pattern to the corresponding memory array;

waiting for a period of time sufficient to write the predetermined data pattern to all portions of the plurality of memory arrays; and halting the plurality of state machines after the waiting step, the plurality of memory arrays containing the same predetermined data pattern when the plurality of state machines are halted.

* * * * *